United States Patent
Khlat

(10) Patent No.: US 12,143,067 B2
(45) Date of Patent: Nov. 12, 2024

(54) MULTI-TRANSMISSION POWER MANAGEMENT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/668,481

(22) Filed: Feb. 10, 2022

(65) Prior Publication Data

US 2023/0253924 A1 Aug. 10, 2023

(51) Int. Cl.
*H03F 1/02* (2006.01)
*H03F 3/24* (2006.01)
*H04B 1/04* (2006.01)

(52) U.S. Cl.
CPC ........... *H03F 1/0222* (2013.01); *H03F 3/245* (2013.01); *H04B 1/0475* (2013.01); *H03F 2200/105* (2013.01); *H03F 2200/336* (2013.01); *H03F 2200/451* (2013.01); *H04B 2001/045* (2013.01)

(58) Field of Classification Search
CPC ............ H04B 1/0475; H04B 2001/045; H03F 1/0222; H03F 3/245; H03F 2200/105; H03F 2200/336; H03F 2200/451
USPC ........................................................... 375/297
See application file for complete search history.

(56) References Cited

U.S. PATENT DOCUMENTS

| 2014/0335805 | A1* | 11/2014 | Briffa | H03F 3/24 |
| | | | | 455/127.3 |
| 2019/0165738 | A1* | 5/2019 | Pan | H03F 1/0288 |
| 2020/0228063 | A1* | 7/2020 | Khlat | H03F 1/0227 |
| 2020/0403661 | A1* | 12/2020 | Khlat | H03F 3/195 |
| 2021/0314870 | A1* | 10/2021 | Hoversten | H04L 27/34 |

FOREIGN PATENT DOCUMENTS

WO 2021034878 A1 2/2021

* cited by examiner

*Primary Examiner* — Kevin M Burd
(74) *Attorney, Agent, or Firm* — Withrow & Terranova, P.L.L.C.

(57) ABSTRACT

A multi-transmission power management circuit is provided. In embodiments disclosed herein, the multi-transmission power management circuit includes multiple quadrature power amplifier circuits each configured to concurrently generate multiple amplified radio frequency (RF) signals based on a respective modulated voltage(s). The multi-transmission power management circuit also includes an envelope tracking (ET) integrated circuit (ETIC) configured to concurrently generate multiple modulated voltages. A control circuit is configured to determine one or more of the multiple quadrature power amplifier circuits that are involved in a multi-transmission scheme. Accordingly, the control circuit can cause the ETIC to provide one or more of the multiple modulated voltages to each of the quadrature power amplifier circuits involved in the multi-transmission scheme. In this regard, the multi-transmission power management circuit can be flexibly configured to support different multi-transmission schemes.

18 Claims, 3 Drawing Sheets

MULTI-TRANSMISSION POWER MANAGEMENT CIRCUIT

FIELD OF THE DISCLOSURE

The technology of the disclosure relates generally to a radio frequency (RF) power management circuit.

BACKGROUND

A fifth-generation (5G) wireless communication system has been widely regarded as a replacement of the third-generation (3G) and fourth-generation (4G) communication systems. As such, the 5G wireless communication system is expected to achieve significantly higher data rates, improved coverage range, enhanced signaling efficiency, and reduced latency than the 3G and 4G communication systems.

The 5G communication system typically communicates radio frequency (RF) signals in a millimeter wave (mm-Wave) RF spectrum. Given that the RF signals transmitted are more susceptible to propagation attenuation and interference in the mmWave RF spectrum, a base station and/or a mobile device(s) typically employs a power amplifier circuit(s) to help improve signal-to-noise ratio (SNR) and/or signal-to-interference-plus-noise ratio (SINR) of the RF signal(s).

In the 5G wireless communication system, a mobile device may be configured to communicate with a base station(s) (e.g., gNB and/or eNB) via a number of multi-transmission schemes, such as multiple-input multiple-output (MIMO) (e.g., 2×2 MIMO, 4×4 MIMO, etc.), dual connectivity (DC), and so on. In one example, the mobile device can concurrently transmit a same RF signal via multiple antennas to achieve spatial diversity. In another example, the mobile device can concurrently transmit multiple different RF signals via multiple antennas to achieve spatial multiplexing. In another example, a mobile device may concurrently communicate multiple RF signals with a 5G base station and a legacy (e.g., 4G) base station. Given that each of the multi-transmission schemes involves simultaneous transmission of multiple RF signals, the mobile device will typically employ multiple power amplifiers to concurrently amplify the multiple RF signals before transmission.

Envelope tracking (ET) is a power management technique designed to improve operating efficiency of the power amplifier(s) to help reduce power consumption and thermal dissipation. In this regard, each of the power amplifiers is configured to amplify a RF signal(s) based on an ET voltage(s) that rises and falls with an amplitude of the RF signal(s). Understandably, the better the ET voltage(s) tracks the amplitude of the RF signal(s), the higher the efficiency can be achieved in the power amplifier(s). In this regard, it is desirable to provide the ET voltage in accordance with a modulation bandwidth and a power envelope of the RF signal(s).

SUMMARY

Embodiments of the disclosure relate to a multi-transmission power management circuit. In embodiments disclosed herein, the multi-transmission power management circuit includes multiple quadrature power amplifier circuits each can concurrently generate multiple amplified radio frequency (RF) signal based on a respective modulated voltage(s). The multi-transmission power management circuit also includes an envelope tracking (ET) integrated circuit (ETIC) that can concurrently generate multiple modulated voltages. A control circuit is configured to determine one or more of the multiple quadrature power amplifier circuits that are involved in a multi-transmission scheme. Accordingly, the control circuit can cause the ETIC to provide one or more of the multiple modulated voltages to each quadrature power amplifier circuits involved in the multi-transmission scheme. In this regard, the multi-transmission power management circuit can be flexibly configured to support different multi-transmission schemes.

In one aspect, a multi-transmission power management circuit is provided. The multi-transmission power management circuit includes at least two quadrature power amplifier circuits each configured to amplify a respective one or two RF signals. The multi-transmission power management circuit also includes an ETIC. The ETIC includes at least two voltage circuits each configured to generate a respective one of at least two modulated voltages. The ETIC also includes a control circuit. The control circuit is configured to determine a multi-transmission scheme. The control circuit is also configured to determine one or more of the at least two quadrature power amplifier circuits involved in the multi-transmission scheme. The control circuit is also configured to cause one or more of the at least two modulated voltages to be provided to the determined one or more of the at least two quadrature power amplifier circuits involved in the multi-transmission scheme to amplify the respective one or two RF signals.

In another aspect, a multi-transmission power management circuit is provided. The multi-transmission power management circuit includes at least two quadrature power amplifier circuits each configured to amplify a respective one or two RF signals. The multi-transmission power management circuit also includes an ETIC. The ETIC is configured to provide a low-frequency current to each of the at least two quadrature power amplifier circuits. The multi-transmission power management circuit also includes a distributed ETIC (DETIC). The DETIC includes at least two voltage circuits each configured to generate a respective one of at least two modulated voltages. The DETIC also includes a control circuit. The control circuit is configured to determine a multi-transmission scheme. The control circuit is also configured to determine one or more of the at least two quadrature power amplifier circuits involved in the multi-transmission scheme. The control circuit is also configured to cause one or more of the at least two modulated voltages to be provided to the determined one or more of the at least two quadrature power amplifier circuits involved in the multi-transmission scheme to amplify the respective one or two RF signals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
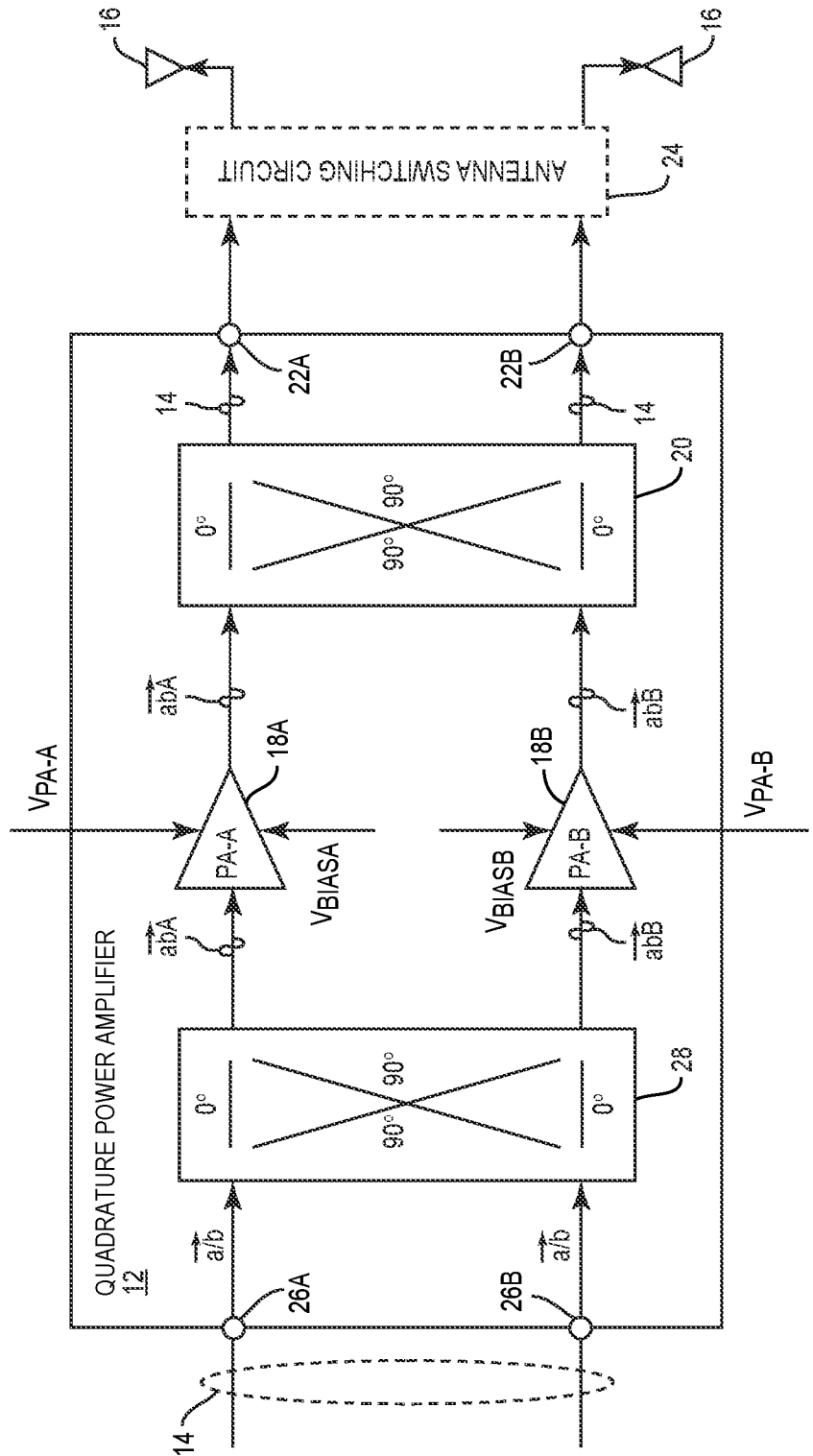
FIG. 1 is a schematic diagram of an exemplary quadrature power amplifier circuit wherein a quadrature power amplifier is configured to amplify at least one radio frequency (RF) signal for transmission over one or two antennas.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-transmission power management circuit. In embodiments disclosed herein, the multi-transmission power management circuit includes multiple quadrature power amplifier circuits each configured to concurrently generate multiple amplified radio frequency (RF) signals based on a respective modulated voltage(s). The multi-transmission power management circuit also includes an envelope tracking (ET) integrated circuit (ETIC) configured to concurrently generate multiple modulated voltages. A control circuit is configured to determine one or more of the multiple quadrature power amplifier circuits that are involved in a multi-transmission scheme. Accordingly, the control circuit can cause the ETIC to provide one or more of the multiple modulated voltages to each of the quadrature power amplifier circuits involved in the multi-transmission scheme. In this regard, the multi-transmission power management circuit can be flexibly configured to support different multi-transmission schemes.

FIG. 1 is a schematic diagram of an exemplary quadrature power amplifier circuit 10 wherein a quadrature power amplifier 12 is configured to amplify at least one RF signal 14 for transmission over one or two antennas 16. The quadrature power amplifier 12 includes a first power amplifier 18A (denoted as "PA-A") and a second power amplifier 18B (denoted as "PA-B"). The first power amplifier 18A is configured to amplify a first composite signal $\vec{abA}$ based on a first modulated voltage $V_{PA-A}$ and a first bias voltage $V_{BiasA}$. The second power amplifier 18B is configured to amplify a second composite signal abB based on a second modulated voltage $V_{PA-B}$ and a second bias voltage $V_{BiasB}$. Each of the first composite signal $\vec{abA}$ and the second composite abB is a reconstructed signal from the RF signal 14. As such, each of the first composite signal $\vec{abA}$ and the second composite $\vec{abB}$ includes the RF signal 14.

The quadrature power amplifier 12 includes an output circuit 20 configured to couple the first power amplifier 18A and the second power amplifier 18B with a first signal output 22A and a second signal output 22B, respectively. The output circuit 20 receives the amplified first composite signal $\vec{abA}$ and the amplified second composite signal $\vec{abB}$ from the first power amplifier 18A and the second power amplifier 18B, respectively. Accordingly, the output circuit 20 regenerates the RF signal 14 from the amplified first composite signal $\vec{abA}$ and the amplified second composite signal $\vec{abB}$. The quadrature power amplifier 12 can be configured to output the RF signal 14 via any one or more of the first signal output 22A and the second signal output 22B.

The first signal output 22A and the second signal output 22B may be coupled to the antennas 16 via an antenna switching circuit 24. The antenna switching circuit 24 can include any type and combination of switches to selectively couple the first signal output 22A and the second signal output 22B to any one or more of the antennas 16.

The quadrature power amplifier 12 may include a first signal input 26A and a second signal input 26B, which can be coupled to a transceiver circuit (not shown) to receive the RF signal 14. The quadrature power amplifier 12 may also include an input circuit 28. The input circuit 28 can be configured to generate the first composite signal $\overrightarrow{abA}$ and the second composite $\overrightarrow{abB}$ to each include the RF signal 14.

The quadrature power amplifier circuit 10 can be configured to operate based on various configurations. In one configuration, the RF signal 14 includes a single RF signal $\vec{a}$, which may be received via either the first signal input 26A or the second signal input 26B. Accordingly, the input circuit 28 will split the RF signal a into the first composite signal $\overrightarrow{abA}$ and the second composite signal $\overrightarrow{abB}$, each have one-half (½) power of the RF signal $\vec{a}$, to be amplified by the first power amplifier 18A and the second power amplifier 18B, respectively. Since the first power amplifier 18A and the second power amplifier 18B are amplifying the same RF signal $\vec{a}$, the first modulated voltage $V_{PA-A}$ can be equal to the second modulated voltage $V_{PA-B}$ and the first bias voltage $V_{BiasA}$ can be equal to the second bias voltage $V_{BiasB}$. The output circuit 20 regenerates the RF signal $\vec{a}$ from the amplified first composite signal $\overrightarrow{abA}$ and the amplified second composite signal $\overrightarrow{abB}$ and provides the RF signal $\vec{a}$ to the first signal output 22A and the second signal output 22B.

In one embodiment, the antenna switching circuit 24 can be configured to couple one of the first signal output 22A and the second signal output 22B to both antennas 16 such that the RF signal $\vec{a}$ can be transmitted concurrently via the antennas 16 to achieve spatial diversity. In another embodiment, the antenna switching circuit 24 can be configured to couple both the first signal output 22A and the second signal output 22B to one of the antennas 16 such that the RF signal $\vec{a}$ can be transmitted at a higher power.

In another configuration, the RF signal 14 includes two different RF signals $\vec{a}$ and $\vec{ab}$, which are received via the first signal input 26A and the second signal input 26B, respectively. Accordingly, the input circuit 28 will generate the first composite signal $\overrightarrow{abA}$, which contains an in-phase component of the RF signal a and a quadrature component of the RF signal $\vec{b}$, and the second composite $\overrightarrow{abB}$, which contains an in-phase component of the RF signal $\vec{b}$ and a quadrature component of the RF signal $\vec{a}$, to be amplified by the first power amplifier 18A and the second power amplifier 18B, respectively. Since the first power amplifier 18A and the second power amplifier 18B are amplifying different RF signals $\vec{a}$ and $\vec{b}$, the first modulated voltage $V_{PA-A}$ may be different from the second modulated voltage $V_{PA-B}$ and the first bias voltage $V_{BiasA}$ may be different from the second bias voltage $V_{BiasB}$.

The output circuit 20 regenerates the RF signals $\vec{a}$ and $\vec{b}$ from the amplified first composite signal $\overrightarrow{abA}$ and the amplified second composite signal $\overrightarrow{abB}$ and provides the RF signals $\vec{a}$ and $\vec{b}$ to the first signal output 22A and the second signal output 22B, respectively. The antenna switching circuit 24 can be configured to couple each of the RF signals $\vec{a}$ and $\vec{b}$ to a respective one of the antennas 16 such that the RF signals $\vec{a}$ and $\vec{b}$ can be transmitted concurrently to achieve spatial multiplexing.

For an in-depth description of the quadrature power amplifier 12, please refer to Patent Cooperation Treaty (PCT) Patent Application Number PCT/US2020/046895, entitled "MULTI-MODE POWER AMPLIFIER APPARATUS."

As described above, the quadrature power amplifier circuit 10 can be adapted to amplify one or more RF signals for transmission via one or more of the antennas 16. As such, it is possible to employ the quadrature power amplifier circuit 10 in a multi-transmission power management circuit according to various embodiments of the present disclosure. As described in FIG. 2 and FIG. 3, a multi-transmission power management circuit employing an appropriate number of the quadrature power amplifier circuit 10 can be flexibly configured to support various multi-transmission schemes, including but not limited to multiple-input multiple-output (MIMO) spatial diversity, MIMO spatial multiplexing, and dual connectivity (DC).

Figure 2:
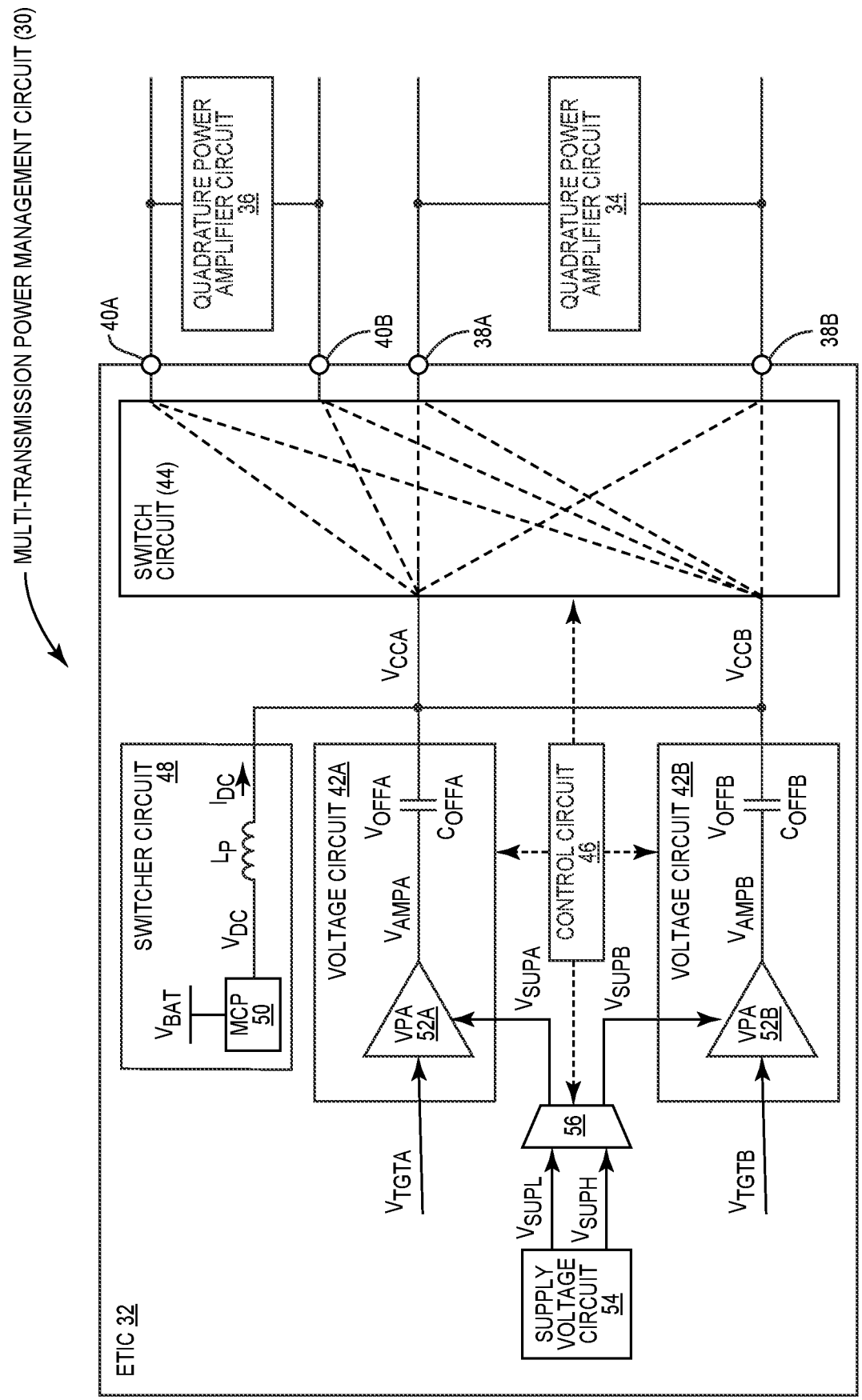
FIG. 2 is a schematic diagram of an exemplary multi-transmission power management circuit configured according to one embodiment of the present disclosure.

FIG. 2 is a schematic diagram of an exemplary multi-transmission power management circuit 30 configured according to one embodiment of the present disclosure. The multi-transmission power management circuit 30 includes an ETIC 32 and at least two quadrature power amplifier circuits 34, 36. In a non-limiting example, each of the quadrature power amplifier circuits 34, 36 is identical to the quadrature power amplifier circuit 10 of FIG. 1. In an embodiment, the quadrature power amplifier circuit 34 (also referred to as "first quadrature power amplifier circuit") is coupled between a first voltage output 38A and a second voltage output 38B. The quadrature power amplifier circuit 36 (also referred to as "second quadrature power amplifier circuit") is coupled between a first auxiliary voltage output 40A and a second auxiliary voltage output 40B.

The ETIC 32 includes at least two voltage circuits 42A (also referred to as "first voltage circuit) and 42B (also referred to as "second voltage circuit"). The first voltage circuit 42A is configured to generate a first modulated voltage $V_{CCA}$ (e.g., ET modulated voltage) and the second voltage circuit 42B is configured to generate a second modulated voltage (e.g., ET modulated voltage) $V_{CCB}$. In an embodiment, the ETIC 32 also includes a switch circuit 44, which can be controlled to couple each of the first voltage circuit 42A and the second voltage circuit 42B to any one or more of the first voltage output 38A, the second voltage output 38B, the first auxiliary voltage output 40A, and the second auxiliary voltage output 40B. In this regard, any of the first voltage output 38A, the second voltage output 38B, the first auxiliary voltage output 40A, and the second auxiliary voltage output 40B can output either the first modulated voltage $V_{CCA}$ or the second modulated voltage $V_{CCB}$. Accordingly, any of the first quadrature power amplifier circuit 34 and the second quadrature power amplifier circuit 36 can receive the first modulated voltage $V_{CCA}$ and/or the second modulated voltage $V_{CCB}$.

The ETIC 32 can further include a control circuit 46, which can be a field-programmable gate array (FPGA), as an example. In embodiments disclosed herein, the control circuit 46 is configured to determine a multi-transmission scheme (e.g., MIMO spatial diversity, MIMO spatial multiplexing, DC, etc.) of the multi-transmission power management circuit 30. In a non-limiting example, the control circuit 46 can determine the multi-transmission scheme dynamically based on an indication from a transceiver circuit (not shown) or statically based on a configuration prestored in a memory circuit (not shown) in the ETIC 32. Based on the determined multi-transmission scheme, the control circuit 46 can determine one or more of the first quadrature power amplifier circuit 34 and the second quadrature power amplifier circuit 36 that are needed to carry out the determined multi-transmission scheme. Accordingly, the control circuit 46 may control the switch circuit 44 to selectively provide one or more of the first modulated voltage $V_{CCA}$ and the second modulated voltage $V_{CCB}$ to the determined one or more of the first quadrature power amplifier circuit 34 and the second quadrature power amplifier circuit 36 that are involved in the multi-transmission scheme.

In one non-limiting example, the control circuit 46 may determine that only the first quadrature power amplifier circuit 34 is involved in transmitting one RF signal based on, for example, a 2×2 MIMO spatial diversity scheme. In this regard, the control circuit 46 may activate the first voltage circuit 42A or the second voltage circuit 42B to generate the first modulated voltage $V_{CCA}$ or the second modulated voltage $V_{CCB}$. Accordingly, the control circuit 46 may control the switch circuit 44 to provide the first modulated voltage $V_{CCA}$ or the second modulated voltage $V_{CCB}$ to the first quadrature power amplifier circuit 34 via any of the first voltage output 38A and the second voltage output 38B.

In another non-limiting example, the control circuit 46 may determine that only the first quadrature power amplifier circuit 34 is involved in transmitting two different RF signals based on, for example, a 2×2 MIMO spatial multiplexing scheme. In this regard, the control circuit 46 may activate both the first voltage circuit 42A and the second voltage circuit 42B to generate the first modulated voltage $V_{CCA}$ and the second modulated voltage $V_{CCB}$, respectively. Accordingly, the control circuit 46 may control the switch circuit 44 to provide the first modulated voltage $V_{CCA}$ and the second modulated voltage $V_{CCB}$ to the first quadrature power amplifier circuit 34 via the first voltage output 38A and the second voltage output 38B, respectively.

In another non-limiting example, the control circuit 46 may determine that the first quadrature power amplifier circuit 34 is involved in transmitting one RF signal based on, for example, a 2×2 MIMO spatial diversity scheme, while the second quadrature power amplifier circuit 36 is involved in transmitting another one RF signal with boosted power. In this regard, the control circuit 46 may activate both the first voltage circuit 42A and the second voltage circuit 42B to generate the first modulated voltage $V_{CCA}$ and the second modulated voltage $V_{CCB}$, respectively. Accordingly, the control circuit 46 may control the switch circuit 44 to provide the first modulated voltage $V_{CCA}$ to the first quadrature power amplifier circuit 34 via any of the first voltage output 38A and the second voltage output 38B, and to provide the second modulated voltage $V_{CCB}$ to the second quadrature power amplifier circuit 36 via any of the first auxiliary voltage output 40A and the second auxiliary voltage output 40B.

In another non-limiting example, the control circuit 46 may determine that the first quadrature power amplifier circuit 34 and the second quadrature power amplifier circuit 36 are each involved in transmitting a respective RF signal based on, for example, a 2×2 MIMO spatial diversity scheme. In this regard, the control circuit 46 may activate both the first voltage circuit 42A and the second voltage circuit 42B to generate the first modulated voltage $V_{CCA}$ and the second modulated voltage $V_{CCB}$, respectively. Accordingly, the control circuit 46 may control the switch circuit 44 to provide the first modulated voltage $V_{CCA}$ to the first quadrature power amplifier circuit 34 via any of the first voltage output 38A and the second voltage output 38B, and to provide the second modulated voltage $V_{CCB}$ to the second quadrature power amplifier circuit 36 via any of the first auxiliary voltage output 40A and the second auxiliary voltage output 40B.

In another non-limiting example, the control circuit 46 may determine that the first quadrature power amplifier circuit 34 and the second quadrature power amplifier circuit 36 are both involved in transmitting an identical RF signal based on, for example, a 4×4 MIMO spatial diversity scheme. In this regard, the control circuit 46 may activate the first voltage circuit 42A or the second voltage circuit 42B to generate the first modulated voltage $V_{CCA}$ or second modulated voltage $V_{CCB}$. Accordingly, the control circuit 46 may control the switch circuit 44 to provide the first modulated voltage $V_{CCA}$ or the second modulated voltage $V_{CCB}$ to the first quadrature power amplifier circuit 34 via any of the first voltage output 38A and the second voltage output 38B, and to the second quadrature power amplifier circuit 36 via any of the first auxiliary voltage output 40A and the second auxiliary voltage output 40B.

The ETIC 32 can include a switcher circuit 48, which includes a multi-level charge pump (MCP) 50 and a power inductor LP. The MCP 50, which can be an inductor-based or capacitor-based buck-boost direct-current (DC) to DC (DC-DC) converter, as an example, is configured to generate a low-frequency voltage $V_{DC}$ (e.g., a constant or average voltage) as a function of a battery voltage $V_{BAT}$. In an embodiment, the MCP 50 may operate in a buck mode to generate the low-frequency voltage $V_{DC}$ that equals $0 \times V_{BAT}$ or $1 \times V_{BAT}$, or in a boost mode to generate the low-frequency voltage $V_{DC}$ at $2 \times V_{BAT}$. Thus, by alternating between $0 \times V_{BAT}$, $1 \times V_{BAT}$, and/or $2 \times V_{BAT}$ based on a specific duty cycle, the MCP 50 can generate the low-frequency voltage $V_{DC}$ at any desired levels. The power inductor is configured to induce a low-frequency current (e.g., a constant or average current) based on the low-frequency voltage $V_{DC}$. The power inductor LP is coupled to the switch circuit 44 to thereby provide the low-frequency current IDC to any one or more of the first quadrature power amplifier circuit 34 and the second quadrature power amplifier circuit 36.

The first voltage circuit 42A includes a first voltage amplifier 52A and a first offset capacitor $C_{OFFA}$. The first voltage amplifier 52A is configured to generate a first initial modulated voltage $V_{AMPA}$ based on a first modulated target voltage $V_{TGTA}$ and a first supply voltage $V_{SUPA}$. The first offset capacitor $C_{OFFA}$ is configured to raise the first initial modulated voltage $V_{AMPA}$ by a first offset voltage $V_{OFFA}$ to generate the first modulated voltage $V_{CCA}$ ($V_{CCA}=V_{AMPA}+V_{OFFA}$). In an embodiment, the low-frequency current IDC may be used to modulate the first offset voltage $V_{OFFA}$ to a desired level (e.g., 0.8 V).

The second voltage circuit 42B includes a second voltage amplifier 52B and a second offset capacitor $C_{OFFB}$. The second voltage amplifier 52B is configured to generate a second initial modulated voltage $V_{AMPB}$ based on a second modulated target voltage $V_{TGTB}$ and a second supply voltage $V_{SUPB}$. The second offset capacitor $C_{OFFB}$ is configured to raise the second initial modulated voltage $V_{AMPB}$ by a second offset voltage $V_{OFFB}$ to generate the second modulated voltage $V_{CCB}$ ($V_{CCB}=V_{AMPB}+V_{OFFB}$). In an embodiment, the low-frequency current IDC may be used to modulate the second offset voltage $V_{OFFB}$ to a desired level (e.g., 0.8 V).

The ETIC 32 may also include a supply voltage circuit 54, which can be a capacitor-based buck-boost DC-DC converter, as an example. In an embodiment, the supply voltage circuit 54 is configured to generate a first supply voltage $V_{SUPH}$ and a second supply voltage $V_{SUPL}$ ($V_{SUPH}$>$V_{SUPL}$). The supply voltage circuit 54 may be coupled to an output circuit 56. The output circuit 56 may be controlled by the control circuit 46 to provide any of the first supply voltage $V_{SUPH}$ and the second supply voltage $V_{SUPL}$ to the first voltage amplifier 52A as the first supply voltage $V_{SUPA}$, and to the second voltage amplifier 52B as the first supply voltage $V_{SUPB}$. Notably, by providing an appropriate one of the first supply voltage $V_{SUPH}$ and the second supply voltage $V_{SUPL}$ to the first voltage amplifier 52A and the second voltage amplifier 52B, it is possible to maintain the first voltage amplifier 52A and the second voltage amplifier 52B in a higher operating efficiency, while concurrently avoiding potential amplitude distortion in the first modulated voltage $V_{CCA}$ and the second modulated voltage $V_{CCB}$.

Figure 3:
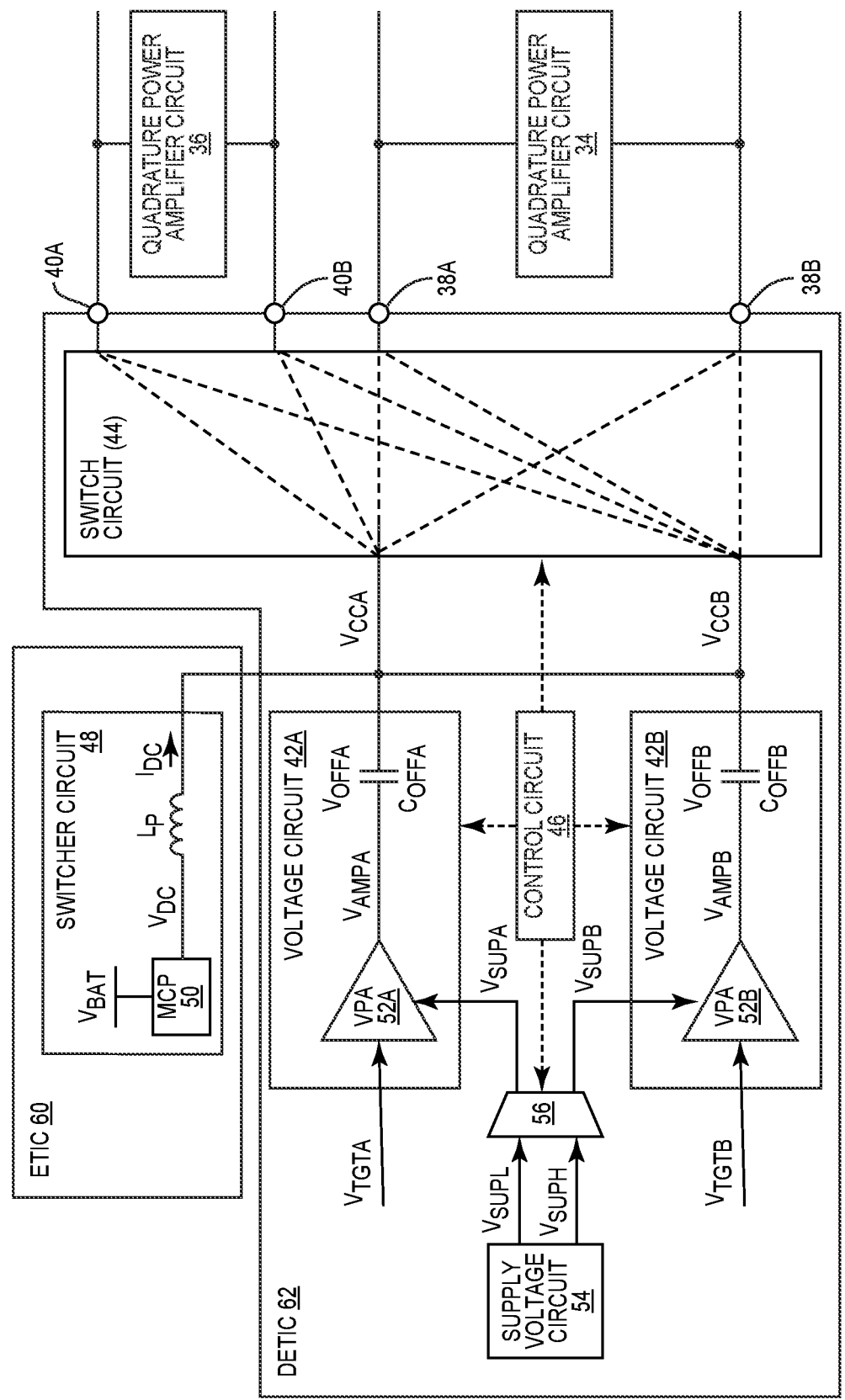
FIG. 3 is a schematic diagram of an exemplary multi-transmission power management circuit configured according to another embodiment of the present disclosure.

Alternative to integrating the switcher circuit 48, the first voltage circuit 42A, and the second voltage circuit 42B into the ETIC 32, it is also possible to provide the switcher circuit 48, the first voltage circuit 42A, and the second voltage circuit 42B in different dies. In this regard, FIG. 3 is a schematic diagram of an exemplary multi-transmission power management circuit 58 configured according to another embodiment of the present disclosure. Common elements between FIGS. 2 and 3 are shown therein with common element numbers and will not be re-described herein.

Herein, the multi-transmission power amplifier circuit 58 includes an ETIC 60 and a distributed ETIC (DETIC) 62. Notably, the ETIC 60 and the DETIC 62 are provided in different dies. Moreover, the DETIC 62 is disposed to be physically closer to the first quadrature power amplifier circuit 34 and the second quadrature power amplifier circuit 36 than the ETIC 60. Understandably, by disposing the DETIC 62 closer to the first quadrature power amplifier circuit 34 and the second quadrature power amplifier circuit 36, it is possible to reduce potential distortions (e.g., voltage ripple) in the first modulated voltage $V_{CCA}$ and the second modulated voltage $V_{CCB}$ as a result of trace inductance associated with a respective coupling path.

Those skilled in the art will recognize improvements and modifications to the preferred embodiments of the present disclosure. All such improvements and modifications are considered within the scope of the concepts disclosed herein and the claims that follow.

What is claimed is:

1. A multi-transmission power management circuit comprising:
    at least two quadrature power amplifier circuits each configured to amplify a respective one or two radio frequency (RF) signals based on one or more of at least two modulated voltages, wherein each of the at least two quadrature power amplifier circuits comprises a pair of power amplifiers each configured to amplify a respective composite signal constructed from the respective one or two RF signals; and
    an envelope tracking (ET) integrated circuit (ETIC) comprising:
        at least two voltage circuits each configured to generate a respective one of the at least two modulated voltages;
        a switch circuit provided between the at least two voltage circuits and the at least two quadrature power amplifier circuits; and
        a control circuit configured to:
            determine that the at least two quadrature power amplifier circuits are configured to amplify an identical one of the respective one or two RF signals;
            control the switch circuit to provide any of the at least two modulated voltages to the at least two quadrature power amplifier circuits to amplify the identical one of the respective one or two RF signals for concurrent transmission;
            determine that any of the at least two quadrature power amplifier circuits are configured to amplify a respective two of the respective one or two RF signals; and
            control the switch circuit to provide the at least two modulated voltages to the determined any of the at least two quadrature power amplifier circuits to amplify the respective two of the respective one or two RF signals.

2. The multi-transmission power management circuit of claim 1, wherein the control circuit is further configured to:
    determine that a first one of the at least two quadrature power amplifier circuits is configured to amplify a respective one of the respective one or two RF signals to generate two respective amplified RF signals for concurrent transmission; and
    cause a first one of the at least two modulated voltages to be provided to the first one of the at least two quadrature power amplifier circuits.

3. The multi-transmission power management circuit of claim 1, wherein the control circuit is further configured to:
    determine that a first one of the at least two quadrature power amplifier circuits is configured to amplify the respective two of the respective one or two RF signals to generate two respective amplified RF signals for concurrent transmission; and
    cause the at least two modulated voltages to be provided to the first one of the at least two quadrature power amplifier circuits.

4. The multi-transmission power management circuit of claim 1, wherein the control circuit is further configured to:
    determine that a first one of the at least two quadrature power amplifier circuits is configured to amplify a respective one of the respective one or two RF signals to generate two respective amplified RF signals for concurrent transmission;
    cause a first one of the at least two modulated voltages to be provided to the first one of the at least two quadrature power amplifier circuits;
    determine that a second one of the at least two quadrature power amplifier circuits is configured to amplify a respective one of the respective one or two RF signals to generate one respective amplified RF signal for transmission; and
    cause a second one of the at least two modulated voltages to be provided to the second one of the at least two quadrature power amplifier circuits.

5. The multi-transmission power management circuit of claim 1, wherein the control circuit is further configured to:
    determine that a first one of the at least two quadrature power amplifier circuits is configured to amplify a respective one of the respective one or two RF signals to generate two respective amplified RF signals for concurrent transmission;

cause a first one of the at least two modulated voltages to be provided to the first one of the at least two quadrature power amplifier circuits;

determine that a second one of the at least two quadrature power amplifier circuits is configured to amplify a respective one of the respective one or two RF signals to generate two respective amplified RF signals for concurrent transmission; and cause a second one of the at least two modulated voltages to be provided to the second one of the at least two quadrature power amplifier circuits.

6. The multi-transmission power management circuit of claim 1, wherein the ETIC further comprises a switcher circuit that comprises:

a multi-level charge pump (MCP) configured to generate a low-frequency voltage as a function of a battery voltage; and a power inductor configured to induce a low-frequency current based on the low-frequency voltage and provide the low-frequency current to each of the at least two quadrature power amplifier circuits.

7. The multi-transmission power management circuit of claim 1, wherein each of the at least two voltage circuits comprises:

a respective voltage amplifier configured to generate a respective initial modulated voltage based on a respective modulated target voltage and a respective supply voltage; and a respective offset capacitor configured to raise the respective initial modulated voltage by a respective offset voltage to generate the respective one of the at least two modulated voltages.

8. The multi-transmission power management circuit of claim 7, wherein:

the ETIC further comprises a supply voltage circuit configured to generate a first supply voltage and a second supply voltage lower than the first supply voltage; and the control circuit is further configured to cause any of the first supply voltage and the second supply voltage to be provided to the respective voltage amplifier in each of the at least two voltage circuits.

9. A multi-transmission power management circuit comprising:

at least two quadrature power amplifier circuits each configured to amplify a respective one or two radio frequency (RF) signals based on one or more of at least two modulated voltages, wherein each of the at least two quadrature power amplifier circuits comprises a pair of power amplifiers each configured to amplify a respective composite signal constructed from the respective one or two RF signals;

an envelope tracking (ET) integrated circuit (ETIC) configured to provide a low-frequency current to each of the at least two quadrature power amplifier circuits; and a distributed ETIC (DETIC) comprising:

at least two voltage circuits each configured to generate a respective one of the at least two modulated voltages;

a switch circuit provided between the at least two voltage circuits and the at least two quadrature power amplifier circuits; and a control circuit configured to:

determine that the at least two quadrature power amplifier circuits are configured to amplify an identical one of the respective one or two RF signals;

control the switch circuit to provide any of the at least two modulated voltages to the at least two quadrature power amplifier circuits to amplify the identical one of the respective one or two RF signals for concurrent transmission;

determine that any of the at least two quadrature power amplifier circuits are configured to amplify a respective two of the respective one or two RF signals; and control the switch circuit to provide the at least two modulated voltages to the determined any of the at least two quadrature power amplifier circuits to amplify the respective two of the respective one or two RF signals.

10. The multi-transmission power management circuit of claim 9, wherein the control circuit is further configured to:

determine that a first one of the at least two quadrature power amplifier circuits is configured to amplify a respective one of the respective one or two RF signals to generate two respective amplified RF signals for concurrent transmission; and cause a first one of the at least two modulated voltages to be provided to the first one of the at least two quadrature power amplifier circuits.

11. The multi-transmission power management circuit of claim 9, wherein the control circuit is further configured to:

determine that a first one of the at least two quadrature power amplifier circuits is configured to amplify the respective two of the respective one or two RF signals to generate two respective amplified RF signals for concurrent transmission; and cause the at least two modulated voltages to be provided to the first one of the at least two quadrature power amplifier circuits.

12. The multi-transmission power management circuit of claim 9, wherein the control circuit is further configured to:

determine that a first one of the at least two quadrature power amplifier circuits is configured to amplify a respective one of the respective one or two RF signals to generate two respective amplified RF signals for concurrent transmission;

cause a first one of the at least two modulated voltages to be provided to the first one of the at least two quadrature power amplifier circuits;

determine that a second one of the at least two quadrature power amplifier circuits is configured to amplify a respective one of the respective one or two RF signals to generate one respective amplified RF signal for transmission; and cause a second one of the at least two modulated voltages to be provided to the second one of the at least two quadrature power amplifier circuits.

13. The multi-transmission power management circuit of claim 9, wherein the control circuit is further configured to:

determine that a first one of the at least two quadrature power amplifier circuits is configured to amplify a respective one of the respective one or two RF signals to generate two respective amplified RF signals for concurrent transmission;

cause a first one of the at least two modulated voltages to be provided to the first one of the at least two quadrature power amplifier circuits;

determine that a second one of the at least two quadrature power amplifier circuits is configured to amplify a respective one of the respective one or two RF signals to generate two respective amplified RF signals for concurrent transmission; and cause a second one of the at least two modulated voltages to be provided to the second one of the at least two quadrature power amplifier circuits.

14. The multi-transmission power management circuit of claim 9, wherein the ETIC comprises a switcher circuit, the switcher circuit comprising:
   a multi-level charge pump (MCP) configured to generate a low-frequency voltage as a function of a battery voltage; and
   a power inductor configured to induce the low-frequency current based on the low-frequency voltage and provide the low-frequency current.

15. The multi-transmission power management circuit of claim 9, wherein each of the at least two voltage circuits comprises:
   a respective voltage amplifier configured to generate a respective initial modulated voltage based on a respective modulated target voltage and a respective supply voltage; and
   a respective offset capacitor configured to raise the respective initial modulated voltage by a respective offset voltage to generate the respective one of the at least two modulated voltages.

16. The multi-transmission power management circuit of claim 15, wherein:
   the ETIC further comprises a supply voltage circuit configured to generate a first supply voltage and a second supply voltage lower than the first supply voltage; and
   the control circuit is further configured to cause any of the first supply voltage and the second supply voltage to be provided to the respective voltage amplifier in each of the at least two voltage circuits.

17. The multi-transmission power management circuit of claim 9, wherein the ETIC and the DETIC are provided in different dies.

18. The multi-transmission power management circuit of claim 9, wherein a respective coupling distance between the DETIC and a respective one of the at least two quadrature power amplifier circuits is shorter than a respective coupling distance between the ETIC and the respective one of the at least two quadrature power amplifier circuits.

* * * * *

UNITED STATES PATENT AND TRADEMARK OFFICE
CERTIFICATE OF CORRECTION

PATENT NO. : 12,143,067 B2  
APPLICATION NO. : 17/668481  
DATED : November 12, 2024  
INVENTOR(S) : Nadim Khlat Page 1 of 1

It is certified that error appears in the above-identified patent and that said Letters Patent is hereby corrected as shown below:

In the Specification

In Column 4, Line 42, replace "abB" with --$\overrightarrow{abB}$--.

In Column 5, true Line 16, replace "RF signal a into" with --RF signal $\vec{a}$ into--.

In Column 5, Line 46, replace "$\overrightarrow{ab}$" with --$\vec{b}$--.

In Column 5, Line 51, replace "RF signal a and" with --RF signal $\vec{a}$ and--.

In the Claims

In Column 10, Line 7, replace "identical one of the respective one or two" with --identical one of the one or two--.

Signed and Sealed this  
Tenth Day of December, 2024

Katherine Kelly Vidal  
*Director of the United States Patent and Trademark Office*